(12) United States Patent
Jeong et al.

(10) Patent No.: US 7,755,383 B2
(45) Date of Patent: Jul. 13, 2010

(54) CALIBRATION CIRCUIT, SEMICONDUCTOR MEMORY DEVICE INCLUDING THE SAME, AND OPERATING METHOD OF THE CALIBRATION CIRCUIT

(75) Inventors: Chun-Seok Jeong, Kyoungki-do (KR); Seok-Cheol Yoon, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/165,110

(22) Filed: Jun. 30, 2008

(65) Prior Publication Data

US 2009/0273364 A1    Nov. 5, 2009

(30) Foreign Application Priority Data

Apr. 30, 2008    (KR) .................. 10-2008-0040371

(51) Int. Cl.
*H03K 19/003* (2006.01)
(52) U.S. Cl. .......................... 326/30; 326/26
(58) Field of Classification Search ............ 326/30, 326/26
See application file for complete search history.

(56) References Cited

U.S. PATENT DOCUMENTS

| 6,754,132 | B2 * | 6/2004 | Kyung | ............... 365/233.1 |
| 7,365,564 | B2 * | 4/2008 | Kim | ............... 326/30 |
| 2006/0006903 | A1 * | 1/2006 | Choi et al. | ............... 326/30 |

FOREIGN PATENT DOCUMENTS

| JP | 2000-311025 | 11/2000 |
| KR | 1020050081315 A | 8/2005 |

OTHER PUBLICATIONS

Notice of Allowance issued from Korean Intellectual Property Office on Nov. 25, 2009.

* cited by examiner

Primary Examiner—James Cho
(74) Attorney, Agent, or Firm—IP & T Law Firm PLC

(57) ABSTRACT

Calibration circuit, semiconductor memory device including the same, and operation method of the calibration circuit includes a calibration unit configured to generate a calibration code for controlling a termination resistance value, a calibration control unit configured to count a clock and allow the calibration unit to be enabled during a predetermined clock and a clock control unit configured to selectively supply the clock to the calibration control unit according to an operation mode of a semiconductor device employing the calibration circuit.

10 Claims, 5 Drawing Sheets

4.5.1. ZQ CAL COMMAND TRUTH TABLE

| FUNCTION | CKE | | CS# | RAS# | CAS# | WE# | BA3 ~ BA0 | A15 ~ A13 | A12 | A10 | A11, A9~A0 |
|---|---|---|---|---|---|---|---|---|---|---|---|
| | Prev Cycle | Next Cycle | | | | | | | | | |
| ZQ CALIBRATION LONG(ZQCL) | H | H | L | H | H | L | X | X | X | 1 | X |
| ZQ CALIBRATION SHORT(ZQCS) | H | H | L | H | H | L | X | X | X | 0 | X |

4.5.1. ZQ CAL TIMING PARAMETER

| SYMBOL | DDR3 800/1066/1333/1600 | | |
|---|---|---|---|
| | MIN | MAX | UNITS |
| tZQOper (formerly tZQXSR) | 256 | NA | tCK |
| tZQInit (formerly tZQCL) | 512 | NA | tCK |
| tZQCS | 64 | NA | tCK |

CALIBRATION CIRCUIT, SEMICONDUCTOR MEMORY DEVICE INCLUDING THE SAME, AND OPERATING METHOD OF THE CALIBRATION CIRCUIT

CROSS-REFERENCE TO RELATED APPLICATION

The present invention claims priority of Korean patent application number 10-2008-0040371, filed on Apr. 30, 2008, which is incorporated by reference in its entirety.

BACKGROUND OF THE INVENTION

The present invention relates to a calibration circuit used for calibrating termination resistance values in a variety of semiconductor integration circuits, and more particularly, to a technique to reduce the amount of a current consumed in a calibration circuit.

Various semiconductor devices, such as CPUs, memories, gate arrays and the like, which are realized as IC chips, are incorporated into various electrical products, such as personal computers, servers or work stations. In most cases, each of these semiconductor devices is provided with a receiving circuit for receiving a variety of signals transmitted from the outside of a chip through an input pad, and an output circuit for providing output signals to the outside through an output pad.

Meanwhile, as the operational speed of electrical products has increased, the swing width of a signal interfaced between the semiconductor devices (that is, the voltage difference between the logically low signal state and the logically high signal state) has gradually decreased. This is to minimize the delay time taken in transferring a signal. However, as the swing width of the signal decreases, the influence of external noises increases, and reflectance of the signal due to an impedance mismatching in an interface terminal becomes also serious. The impedance mismatching is generated due to external noises, variations in power voltage, variations in operation temperature, changes in manufacturing process, or the like. When an impedance mismatch is present, it is difficult to transmit data at a high speed, and output data outputted from an output terminal of the semiconductor device may be distorted. Accordingly, when a semiconductor device of a receiving side receives the distorted output signal through an input terminal, problems, such as setup/hold fail or an error in determining an input level may be frequently caused.

In particular, memory devices, which require a high operational speed, employ an impedance matching circuit called 'on die termination' around a pad in an integrated circuit chip for solving the aforementioned problems. Typically, in the on die termination scheme, a source termination is performed by an output circuit at a transmitting side, and a parallel termination is performed by a termination circuit connected in parallel with respect to a receiving circuit connected to the input pad at a receiving side.

ZQ calibration indicates a procedure to generate a calibration code varying with conditions of PVT (Process, Voltage, Temperature). Termination resistance values (in the case of memory devices, termination resistance values of a DC pad side) are adjusted using calibration codes generated as a result of ZQ calibration. (Since the calibration is performed using a ZQ node that is a node for calibration, it is called 'ZQ calibration'.)

Hereinafter, a generation of a calibration code in a calibration circuit for controlling resistance values will be described below.

FIG. 1 is a circuit diagram of a calibration circuit used for controlling a termination resistance value in a memory device in accordance with a conventional art.

Referring to FIG. 1, the conventional calibration circuit is configured to include a calibration unit 110, which corresponds to a portion directly generating a calibration code PCODE<0:N>, and a calibration control unit 120 for controlling an operation of the calibration unit 110.

The calibration unit 110 includes a first pull-up resistance unit 111, a second pull-up resistance unit 112, a pull-down resistance unit 113, comparators 114 and 115, and counters 117 and 118. The calibration unit 110 generates calibration codes PCODE<0:N> and NCODE<0:N>, and whether or not the operation of the calibration unit 110 is enabled and the operation time of the calibration unit 110 are controlled by the calibration control unit 120.

In operations, the comparator 114 compares a voltage of a ZQ node generated by connecting a reference resistor 101 (which is an external resistor of the chip, generally 240Ω) connected to a ZQ pad and the first pull-up resistance unit 11 with a reference voltage VREF (which is generally set to VDDQ/2) to generate an UP/DOWN signal.

The counter 117 receives the UP/DOWN signal to generate a binary code PCODE<0:N>, and turns on/off resistors of the first pull-up resistance unit 111 connected in parallel using the generated binary code PCODE<0:N> to control the resistance value. The controlled resistance value of the first pull-up resistance unit 111 again affects the voltage of the ZQ node, and the aforementioned operation is repeated. That is, the first pull-up resistance unit 111 is calibrated (i.e., pull-up calibration) such that a total resistance value (which is generally 240Ω) of the first pull-up resistance unit 111 is equal to the resistance value of the reference resistor 101.

The binary code PCODE<0:N> generated during the aforementioned pull-up calibration is inputted into the second pull-up resistance unit 112 (which has the same construction as the first pull-up resistance unit 111 and receives the same code, resulting in the same resistance value) to determine a total resistance value of the second pull-up resistance unit 112. Next, the pull-down calibration operation starts. Similarly with the case of the pull-up calibration, the pull-down calibration is performed such that a voltage of a-node is equal to the reference voltage VREF using the comparator 115 and the counter 117, i.e., a total resistance value of the pull-down resistance unit 113 is equal to a total resistance value of the second pull-up resistance unit 112. The pull-up calibration code PCODE<0:N> and the pull-down calibration code NCODE<0:N> generated as a result of the aforementioned calibration are inputted into pull-up and pull-down resistance units (which have the same constructions as those of the pull-up and pull-down resistance units of the calibration unit) of the output terminal (DC pad side) of the semiconductor memory device to determine the termination resistance value.

That is, the data output circuit of the semiconductor memory device terminates the input/output node of data to a pull-up level (when a 'high' data is outputted) or pull-down level (when a 'low' data is outputted) using the termination resistance value determined by the pull-up calibration code and the pull-down calibration code to output data.

Enabling of the aforementioned calibration operation is performed by the calibration control unit 120. When a calibration command is enabled, the calibration control unit 120 controls the calibration unit 110 to start the calibration operation. The calibration control unit 120 differently controls the calibration operation time depending on the calibration operation modes (i.e., ZQInit, ZQOper, ZQCS). Detailed descriptions for the calibration operation modes (i.e., ZQInit, ZQOper, ZQCS) and the calibration control unit 120 will be given below with reference to the accompanying drawings.

FIG. 2 shows a calibration command (ZQC) truth table and timing parameters according to the calibration operation modes (i.e., ZQInit, ZQOper, ZQCS) (JEDEC standard).

The calibration command (ZQC) is enabled by a combination of /CS (chip select signal), /RAS (row address strobe signal), /CAS (column address strobe signal), /WE (write enable signal), i.e., /CS='Low', /RAS='High', /CAS='High', /WE='High' as shown in the upper side of FIG. 2.

Calibrations are divided into a long calibration and a short calibration, which are determined by whether the logic level of A10 is high or low in a state that the calibration command is enabled.

Calibration operation times are shown in the lower side of FIG. 2. In detail, the long calibration includes two modes, i.e., ZQInit first performed after a power up, and ZQOper, which is generated by an input from a memory controller while the memory device operates. Times of ZQInit and ZQOper are 512 cycles and 256 cycles in terms of clock, respectively. The operation time of the short calibration is 64 cycles.

FIG. 3 is a block diagram showing a construction of the calibration control unit 120 of FIG. 1.

Referring to FIG. 3, the calibration control unit 120 is configured to include a counting unit 310 and a control unit 320.

The counting unit 310 counts a clock to output a counting code CNTR_OUT<0:N>. In detail, the counting unit 310 increases a value of a code CNTR_OUT<0:N> thereof from when the calibration command ZQC is enabled whenever a clock CLK is enabled.

The control unit 320 allows the calibration unit 110 to be enabled according to the calibration operation modes until the value of the counting code CNTR_OUT<0:N> reaches a predetermined value. For example, during the short calibration (ZQCS is enabled), the control unit 320 allows the calibration unit 110 to be enabled until the value of the counting code CNTR_OUT<0:N> reaches 64. During the long calibration, if ZQInit is enabled, the control unit 320 allows the calibration unit 110 to be enabled until the value of the counting code CNTR_OUT<0:N> reaches 512, and if ZQOper is enabled, the control unit 320 allows the calibration unit 110 to be enabled until the value of the counting code CNTR_OUT<0:N> reaches 256.

Enable signal CAL_OPER outputted from the control unit 320 allows the comparators 114 and 115 to be enabled during a set clock cycle such that the calibration operation is possible. If the comparators 114 and 115 fail to perform a comparing operation, it is impossible to generate the calibration codes PCODE<0:N> and NCODE<0:N>. Accordingly, the enable signal CAL_OPER may be also referred to as an enable signal of the calibration unit 110. Update signal UPDATE allows the counters 117 and 118 to latch the calibration codes PCODE<0:N> and NCODE<0:N>, and functions to prevent a glitch due to a delay difference between the pull-up calibration code PCODE<0:N> and the pull-down calibration code NCODE<0:N>.

In summary, the calibration control unit 120 controls the calibration unit 110 such that when the calibration command ZQC is enabled, the calibration unit 110 can generate correct calibration codes PCODE<0:N> and NCODE<0:N>.

FIG. 4 is a timing diagram showing operations before and after the calibration operation of the memory device.

Referring to FIG. 4, it can be confirmed that regardless of whether it is the long calibration ZQCL or the short calibration ZQCS, only a NOP (Non Operation) command or a DESELECT command is inputted from the memory controller during a predetermined time before and after the calibration operation.

While the memory device performs the calibration operation, a data input/output pin DQ Bus maintains a high-impedance (Hi-Z) state, and data is naturally not inputted or outputted. This is because it is possible to correctly input or output data only when a correct terminal resistance value is determined by the calibration operation.

FIG. 5 is a schematic diagram showing various operations of a DDR3 memory device.

It is necessary to focus on a box 501 in FIG. 5. Referring to FIG. 5, a calibration operation may be performed only when a memory device is an idle state.

The calibration control unit 120 of FIG. 1 receives and counts a clock so as to measure a time of while a calibration operation is enabled.

The clock CLK inputted into the calibration control unit 120 is always inputted in a toggling state. Although the counting unit 310 in the calibration control unit 120 does not output the output value CNTR_OUT<0:N> thereof when a calibration operation is not performed, the counting unit 310 continues to consume an unnecessary current owing to a toggling clock.

That is, since the clock inputted into the calibration control unit 120 is always toggling in the conventional art, it is problematic that the calibration control unit 120 unnecessarily consumes a current.

SUMMARY OF THE INVENTION

Embodiments of the present invention are directed to providing a semiconductor memory device that reduces the amount of a current consumed in a calibration circuit by selectively supplying a clock used for measuring a time when the calibration circuit is enabled.

In accordance with an aspect of the invention, there is provided a calibration unit configured to generate a calibration code for controlling a termination resistance value, a calibration control unit configured to count a clock and allow the calibration unit to be enabled during a predetermined clock and a clock control unit configured to selectively supply the clock to the calibration control unit according to an operation mode of a semiconductor device employing the calibration circuit.

DESCRIPTION OF SPECIFIC EMBODIMENTS

Hereinafter, a semiconductor memory device in accordance with the present invention will be described in detail with reference to the accompanying drawings.

Figure 6:
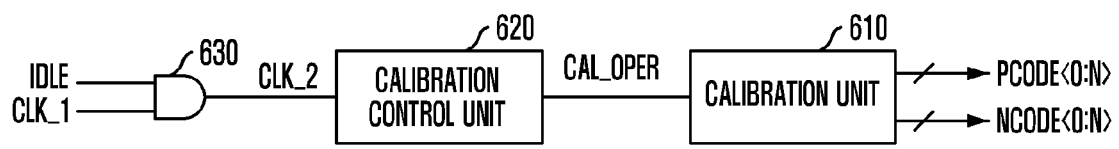
FIG. 6 is a circuit diagram illustrating a calibration circuit in accordance with an embodiment of the present invention.

FIG. 6 is a circuit diagram illustrating a calibration circuit in accordance with an embodiment of the invention.

Referring to FIG. 6, the calibration circuit is configured to include a calibration unit 610, a calibration control unit 620, and a clock control unit 630.

Figure 1:
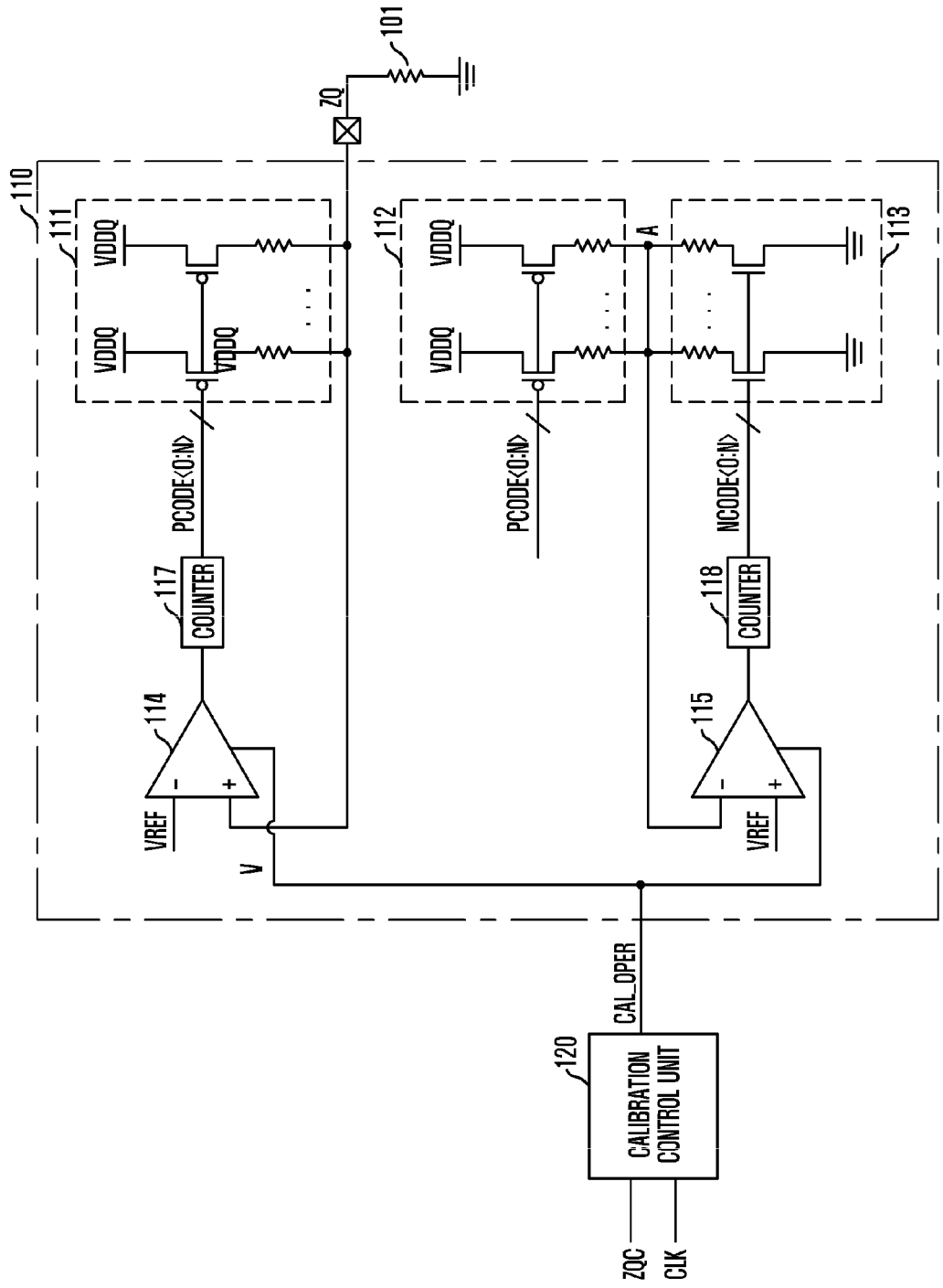
FIG. 1 is a circuit diagram of a calibration circuit used for controlling a termination resistance value in a memory device in accordance with a conventional art.

The calibration unit 610 generates a calibration code PCODE<0:N> for controlling a termination resistance value. The calibration unit 610 may have the same construction as the conventional calibration unit (110 of FIG. 1). While the calibration unit 110 of FIG. 1 can generate both of the pull-up calibration code PCODE<0:N> and the pull-down calibration code NCODE<0:N>, the calibration unit 610 of FIG. 6 may be naturally configured to generate only either the pull-up calibration code PCODE<0:N> or the pull-down calibration code NCODE<0:N>.

In the case of a memory device, a calibration code PCODE<0:N> or NCODE<0:N> generated in the calibration unit 610 is delivered to a data output circuit to control a pull-up termination resistance value or a pull-down termination resistance value, and the data output circuit terminates a data input/output node (DQ node) into a pull-up or pull-down to output a 'high' data or 'low data' to an outside of a chip.

Figures 2, 3:
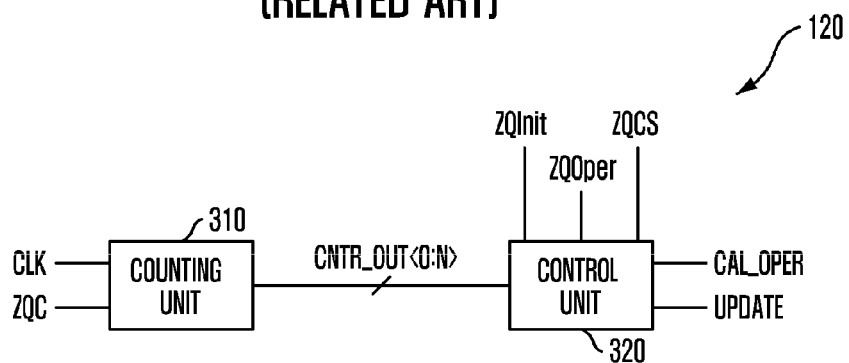
FIG. 2 shows a calibration command (ZQC) truth table and timing parameters according to the calibration operation modes (i.e., ZQInit, ZQOper, ZQCS) (JEDEC standard).
FIG. 3 is a block diagram showing a construction of the calibration control unit 120 of FIG. 1.
Figure 4:
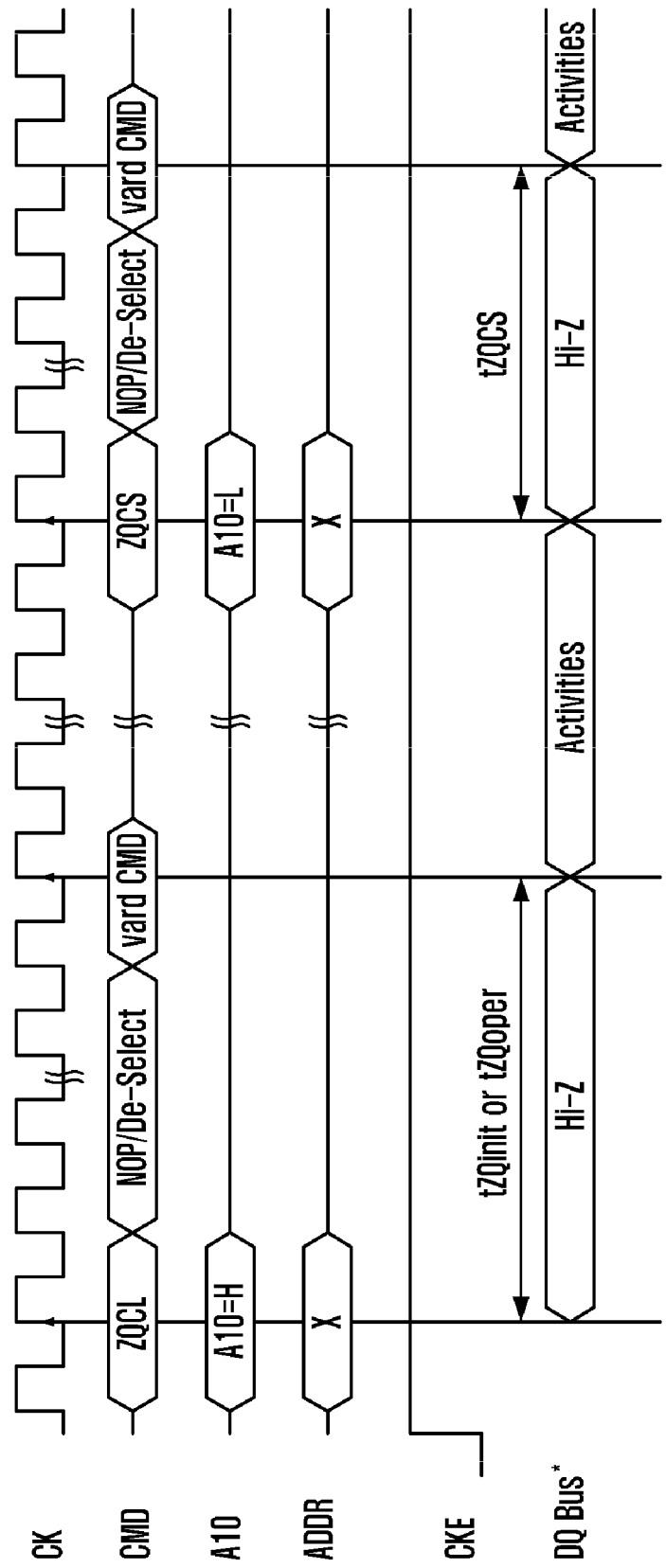
FIG. 4 is a timing diagram showing operations before and after the calibration operation of the memory device.
Figure 5:
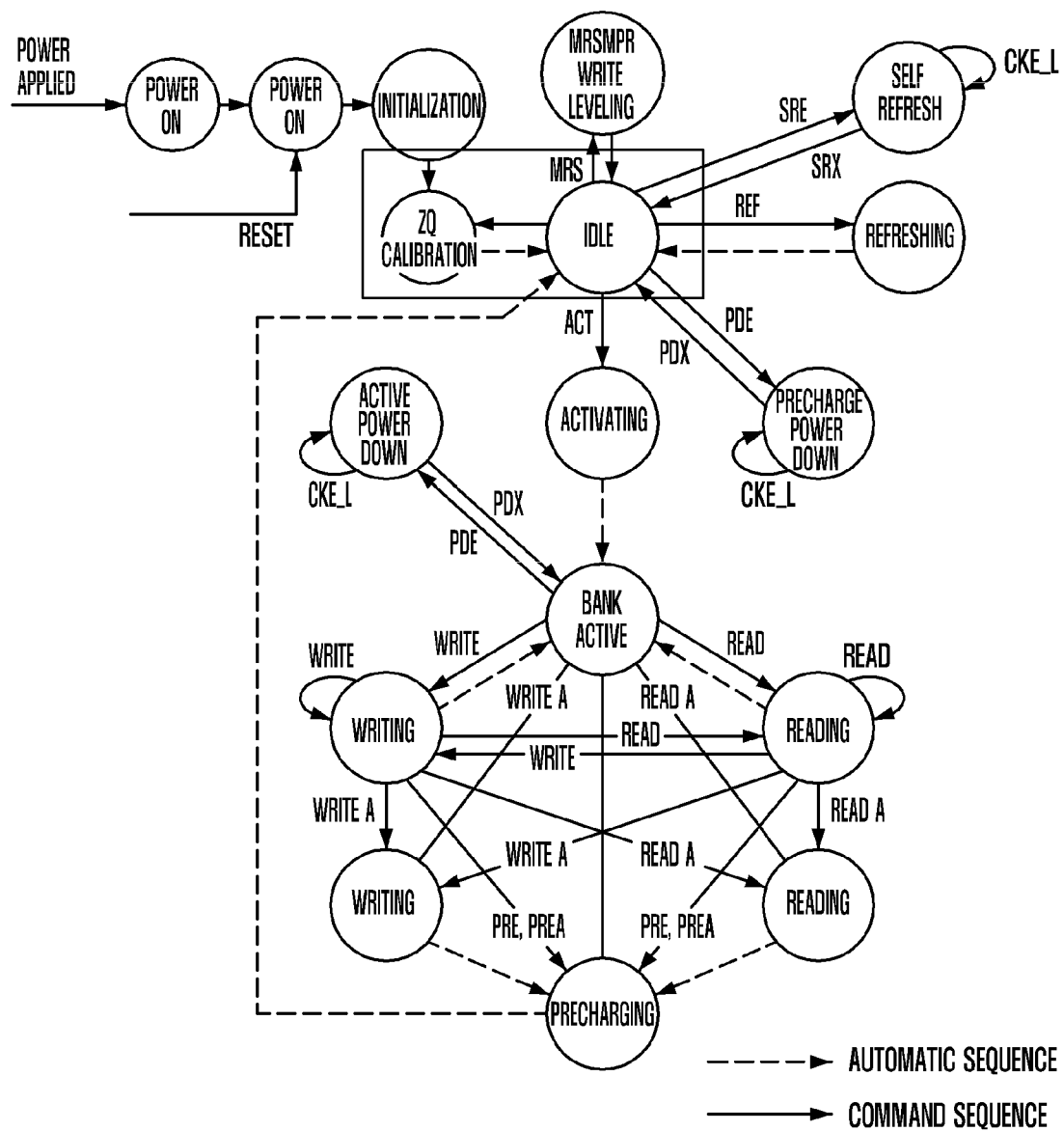
FIG. 5 is a schematic diagram showing various operations of a DDR3 memory device.

The calibration control unit 620 counts a clock CLK_2 to allow the calibration unit 610 to be enabled during a predetermined time. Like the conventional calibration control unit (120 FIGS. 1 and 3), the calibration control unit 620 is configured to include a counting unit 310, which counts the clock CLK_2 to output a counting code CNTR_OUT<0:N>, and a control unit 320, which allows the calibration unit 610 to be enabled until a value of the counting code CNTR_OUT<0:N> reaches a constant value (e.g., 512, 256, 64) according to the calibration operation modes (ZQInit, ZQOPer, ZQCS).

The clock control unit 630 selectively supplies the clock CLK_2 to the calibration control unit 620 according to an operation state of a semiconductor device employing the calibration circuit.

Calibration operations are performed when a semiconductor device employing the calibration circuit does not perform an operation such as data input/output. For example, in the case of a memory device, the calibration operation is performed when the memory device is an idle state as previously described in the background art.

The clock control unit 630 supplies a clock to the calibration control unit 620 only when a semiconductor device can perform the calibration operation. While the semiconductor device performs a data input/output operation, the calibration operation is not performed, and during such a period, the clock CLK_2 is not supplied to the calibration control unit 620 such that the calibration control unit 620 does not consume unnecessary current.

FIG. 6 shows that the clock control unit 630 determines whether or not to supply the clock CLK_2 to the calibration control unit 620 in response to the idle signal IDLE of the memory device. When the idle signal is enabled to 'high', the clock control unit 630 supplies an input clock CLK_1 to the calibration control unit 620 without any change (CLK_1=CLK_2). However, when the idle signal IDLE is disabled to 'low', the clock control unit 630 supplies the calibration control unit 620 with a signal having only a constant level, i.e., a non-toggling signal (CLK_2='low').

Figure 7:
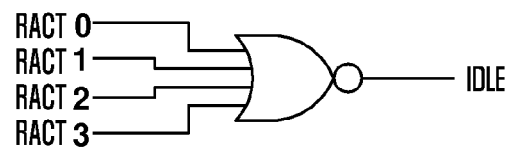
FIG. 7 is a circuit diagram for describing the idle signal IDLE of FIG. 6.

FIG. 7 is a circuit diagram for describing the idle signal IDLE of FIG. 6.

The idle signal IDLE is generated by combining active signals (RACT0, 1, 2, 3) of banks of the memory device. In FIG. 7, RACT# signal is an active signal of each bank. That is, RACT0 is a signal to activate bank 0, RACT1, 2, 3 are signals to activate Banks 1, 2 and 3, respectively.

When RACT0, 1, 2, 3 signals are all disabled to 'low', the idle signal IDLE is enabled to 'high', and when at least one of RACT0, 1, 2, 3 signals is enabled to 'high', the idle signal IDLE is disabled to 'low'.

That is, when any bank is not activated, the idle signal IDLE is enabled whereby it is informed that the memory device is not performing any operation.

Now, a calibration operation method according to an embodiment of the invention will be described with reference to FIGS. 6 and 7.

The calibration operation method according to an embodiment of the invention include: determining a supply section of the clock CLK_2 according to an operation mode of a semiconductor device employing a calibration circuit and supplying the clock CLK_2 during the determined supply section; counting the supplied clock CLK_2 to determine an enable time of the calibration operation; and generating a calibration code PCODE<0:N> or NCODE<0:N> during the determined enable time.

Herein, the number of clocks CLK_2 toggling during the enable time of the calibration operation varies according to the calibration operation mode.

Also, the supply section of the clock CLK_2 corresponds to the idle state of the semiconductor device.

According to the above-described invention, a clock used for measuring an enable time of a calibration circuit is selectively inputted into the calibration circuit, so that a power consumption due to an unnecessary clock toggling can be saved.

While the invention has been described with respect to the specific embodiments, it will be apparent to those skilled in the art that various changes and modifications may be made without departing from the spirit and scope of the invention as defined in the following claims.

In particular, while the above embodiments show and describe calibration circuits employed in memory devices, it will be apparent to those skilled in the art that even when calibration circuits according to embodiments of the invention are applied to semiconductor devices other than the memory devices, if the semiconductor devices is configured to be selectively supplied with a clock according to whether or not the semiconductor devices are in a calibration operation state, the amount of a current consumed by the calibration circuit can be reduced.

What is claimed is:

1. A calibration circuit, comprising:

a calibration unit configured to generate a calibration code for controlling a termination resistance value;

a calibration control unit configured to count pulses of a clock and allow the calibration unit to be enabled during a predetermined time period; and a clock control unit configured to selectively supply the clock to the calibration control unit according to an operation mode of a memory device employing the calibration circuit, wherein the clock control unit determines whether or not to supply the clock in response to an idle signal which is a signal enabled when no banks of the memory device are activated.

2. The calibration circuit as recited in claim 1, wherein the clock control unit comprises an AND gate, which receives the idle signal and the clock to supply the clock to the calibration unit.

3. A calibration circuit, comprising:
a calibration unit configured to generate a calibration code for controlling a termination resistance value;
a calibration control unit configured to count pulses of a clock and allow the calibration unit to be enabled during a predetermined time period; and
a clock control unit configured to selectively supply the clock to the calibration control unit according to an operation mode of a memory device employing the calibration circuit, wherein the clock control unit supplies the clock when the memory device is in an idle state which is a state when no banks of the memory device are activated.

4. A calibration circuit, comprising:
a calibration unit configured to generate a calibration code for controlling a termination resistance value;
a calibration control unit configured to count pulses of a clock and allow the calibration unit to be enabled during a predetermined time period; and
a clock control unit configured to selectively supply the clock to the calibration control unit according to an operation mode of a semiconductor device employing the calibration circuit,
wherein the calibration control unit comprises:
a counting unit configured to count pulses of the clock to output a counting code; and
a control unit configured to allow the calibration unit to be enabled until a value of the counting code reaches a predetermined value according to a selected calibration operation mode.

5. A semiconductor memory device, comprising:
a calibration circuit, which is enabled during a constant time period according to a calibration operation mode to generate a calibration code; and
a data output circuit, which is configured to terminate an input/output node by using a resistance value controlled by the calibration code, to output a data,
wherein the calibration circuit is selectively supplied with a clock for measuring the constant time period according to an operation state of the semiconductor memory device.

6. The semiconductor memory device as recited in claim 5, wherein the calibration circuit is supplied with the clock when the semiconductor memory device is in an idle state.

7. The semiconductor memory device as recited in claim 6, wherein the idle state is a state in which no banks of the semiconductor memory device are activated.

8. A calibration operation method, comprising:
determining a supply section of a clock according to an operation state of a semiconductor device employing a calibration circuit to supply the clock during the determined supply section;
counting the supplied clock to determine an enable time of a calibration operation; and
generating a calibration code during the determined enable time.

9. The calibration operation method as recited in claim 8, wherein the number of clock pulses during the enable time varies according to the calibration operation mode.

10. The calibration operation method as recited in claim 9, wherein the supply section of the clock is determined by whether or not the semiconductor device is in an idle state.

* * * * *